United States Patent [19]

Abou

[11] Patent Number: 4,524,329
[45] Date of Patent: Jun. 18, 1985

[54] OPERATIONAL AMPLIFIER CIRCUIT
[75] Inventor: Shouji Abou, Kawasaki, Japan
[73] Assignee: Kabushiki Kaisha Toshiba, Japan
[21] Appl. No.: 601,362
[22] Filed: Apr. 17, 1984
[30] Foreign Application Priority Data
  Apr. 21, 1983 [JP] Japan ............................ 58-70444
[51] Int. Cl.$^3$ .............................................. H03F 3/45
[52] U.S. Cl. .................................... 330/253; 330/261
[58] Field of Search .............. 330/252, 253, 257, 261, 330/296

[56] References Cited
U.S. PATENT DOCUMENTS
  4,366,444 12/1982 Schade, Jr. .......................... 330/257

OTHER PUBLICATIONS
Gray et al., "Analog MOS Integrated Circuits," IEEE Solid-State Circuits Counsel, IEEE Press Selected Reprint Series, pp. 39-40, 1980.

Primary Examiner—James B. Mullins
Assistant Examiner—G. Wan
Attorney, Agent, or Firm—Finnegan, Henderson, Farabow, Garrett & Dunner

[57] ABSTRACT

An operational amplifier having a differential amplifier section, a level shifting section, an output section and a bias section. In the operational amplifier, the bias section senses any changes in the power voltage and controls the level shifting of the level shifting section with the sensed change in the power voltage so as to remove an offset component in the output voltage of the differential amplifier section which arises from the power voltage change.

15 Claims, 11 Drawing Figures

F I G. 1
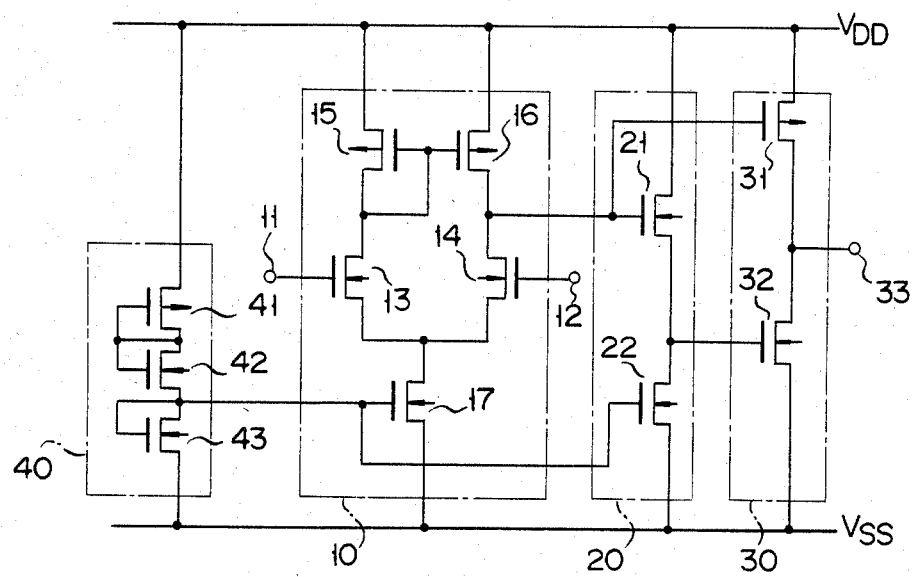
F I G. 2
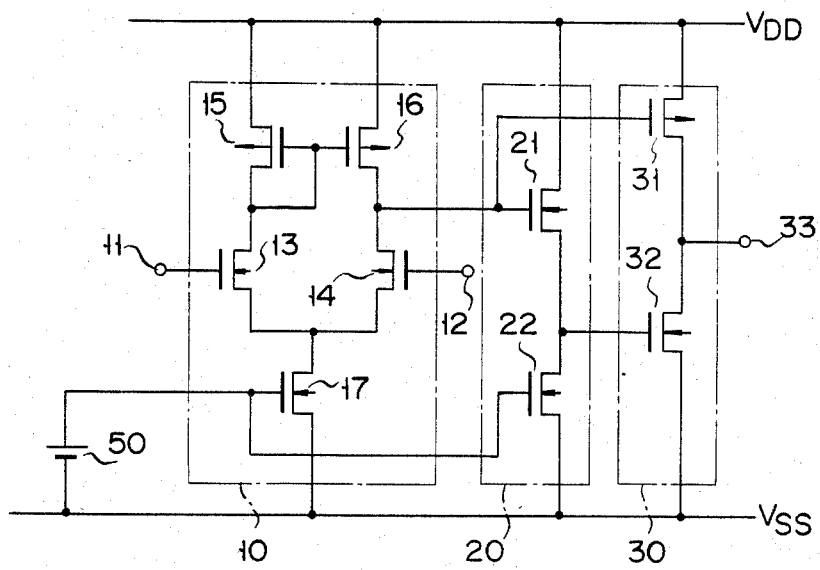

OPERATIONAL AMPLIFIER CIRCUIT

BACKGROUND OF THE INVENTION

The present invention relates to an operational amplifier made up of MOSs (metal oxide semiconductors).

There has been known an operational amplifier of the type described in "Analog MOS Integrated Circuit," pp 39–40 published by IEEE PRESS, 1980, edited by Paul R. Oray et al. The two circuit arrangements shown in FIGS. 1 and 2 are examples of operational amplifiers having a bias circuit. In FIG. 1, a differential amplifier 10, a source follower circuit 20 and an output circuit 30 cooperate to form an operational amplifier. A bias circuit 40 provides bias voltage for the operational amplifier. The differential amplifier 10 is comprised of a pair of N-channel MOS transistors 13 and 14 which are respectively connected at the gates to input terminals 11 and 12 for differential voltage signals, a pair of P-channel MOS transistors 15 and 16 which constitute a current mirror circuit and serve as a load circuit for the transistor pair 13 and 14, and an N-channel MOS transistor 17. The differential amplifier 10 amplifies the difference between the input signals applied to the gates thereof by way of the input terminals 11 and 12, and produces a differentially amplified signal. The source follower circuit 20 is comprised of an N-channel MOS transistor 21 as a drive transistor and an N-channel MOS transistor 22 as a load transistor. Applied to the gate of the MOS transistor 21 is the output signal from the operational amplifier 10. Applied to the gate of the MOS transistor 22 is a bias voltage from the bias circuit 40. The source follower circuit 20 is for shifting the level of output voltage from the differential amplifier 10. The shifted voltage is input to the output circuit 30 comprised of a P-channel MOS transistor 31 and an N-channel MOS transistor. The gate of the MOS transistor 32 is tied with the output of the source follower circuit 20. The gate of the MOS transistor 31 is connected to the output voltage of the source follower circuit 20. The output circuit 30 produces, at an output terminal 33 connected to a junction between the MOS transistors 31 and 32, a voltage signal corresponding to the differential input voltages applied thereto.

The bias circuit 40 is for applying bias voltage to the gates of the transistors 17 and 22 in the differential amplifier 10 and to the source follower circuit 20. The bias circuit 40 is comprised of three MOS transistors 41–43 connected in series between a high potential source $V_{DD}$ and a low potential source $V_{SS}$. The MOS transistor 41 is of the P-channel type, while the MOS transistors 42 and 43 are of the N-channel type. Those transistors 41–43 are used as impedance elements for voltage dividing.

The operational amplifier thus arranged is essentially accompanied by a variation in the power voltage between the high potential source $V_{DD}$ and the low potential source $V_{SS}$, and by a variation of the threshold voltage of each MOS transistor. Those variations create an offset in the output voltage derived from the output terminal of the operational amplifier. To prevent such an offset, those transistors are geometrically designed so that the gate - voltage of the MOS transistors 15, 16 and 31 is equal to that of the MOS transistors 41 in the bias circuit 40, so that the gate - voltage of the MOS transistor 21 is equal to that of the MOS transistor 42 in the bias circuit 40, and so that the gate - voltage of the MOS transistors 17, 22 and 32 is equal to that of the MOS transistor 43 in the bias circuit 40. This approach succeeds in eliminating the offset due to the variation in the power voltage and threshold voltage.

Nevertheless, the variation in the power voltage still directly appears in the gate - voltage of those transistors, resulting in a great variaton in the consumption current. For example, a 10% change in the power voltage between $V_{DD}$ and $V_{SS}$ comes to approximately a 20% change in the consumption current. The end result is that the approximately 10% change of the mutual conductance "gm" greatly influences the gain and band width of the operational amplifier. This narrows the ability of the power voltage to provide an operational amplifier with a good characteristic.

The operational amplifier shown in FIG. 2 uses a constant voltage source 50 in place of the bias circuit 40 used in FIG. 1. Usually the constant voltage source 50 which is incorporated in the operational amplifier is provided separately from the operational amplifier. The constant voltage source 50 may be a zener diode incorporated into the operational amplifier. The MOS transistor 22 applied with a bias voltage from the constant voltage source 50 serves as a constant current source, and always feeds a constant current to the MOS transistor 21. As a result, the gate - voltage of the MOS transistor 21 is constant. The gate - source paths of the MOS transistors 31, 21 and 32 are inserted in series between the high potential source $V_{DD}$ and the low potential source $V_{SS}$, as shown. Therefore, the voltages across these gate - source paths are equal to the power voltage between the $V_{DD}$ and $V_{SS}$. As was just mentioned, the gate - voltage of the MOS transistor 21 is constant. When the power voltage between the $V_{DD}$ and $V_{SS}$ varies, the gate - voltage of each of MOS transistors 31 and 32 then varies. Therefore, when the power voltage increases, the gate - voltage of each of MOS transistors 31 and 32 becomes larger, in order to set the output voltage from the output terminal 33 at a midpoint between the power voltage between the $V_{DD}$ and $V_{SS}$. Since the gate - voltage of the MOS transistor 31 is equal to the source - drain voltage of the MOS transistor 16 in the differential amplifier 10, any increase of the power voltage leads to an increase of the source - drain voltage of the MOS transistor 16. Under this condition, when the source - drain voltage between the MOS transistors 15 and 16 is put out of balance, an offset will appear in the output voltage from the signal output terminal 33. The gate - voltage of the transistors 31 and 32 varies with the variation of the power voltage. Therefore, the range of the power voltage of the operational amplifier which ensures a good characteristic is narrowed, as in the FIG. 1 circuit.

SUMMARY OF THE INVENTION

Accordingly, an object of the present invention is to provide an operational amplifier which exhibits a satisfactory characteristic over a broad range of variation in the power voltage, while containing the small amount offset in the output voltage.

According to the invention, there is provided an operational amplifier comprising a first potential terminal, a second potential terminal, a signal input terminal, a signal output terminal, first, second, third and fourth circuit points, amplifying means for amplifying an input signal applied through said signal input terminal and producing the amplified signal at the output terminal, level shift means for shifting the level of the signal output from said amplifying means, output means for receiving the output signals from said amplifying means and from said level shift means and producing an output signal as specified by said input signals, and bias means for applying a bias voltage to said level shift means. Said level shift means includes: a first MOS transistor of a first channel type in which the current path is connected between said first potential terminal and said first circuit point and the gate is connected to said output terminal of said amplifying means; and a second MOS transistor of a first conductivity type in which the current path is inserted between said second potential terminal and said first circuit point. Said output means includes: a third MOS transistor of said second channel type in which the current path is inserted between said second potential terminal and said output terminal and in which the gate is connected to said output terminal of said amplifying means; and a fourth MOS transistor of said first channel type in which the current path is inserted between said signal output terminal and said second potential terminal and in which the gate is connected to said first circuit point. Said bias means includes: a fifth MOS transistor of said second channel type in which the current path is inserted between said first potential terminal and said second circuit point, and in which the gate is connected to said second circuit point; a first constant current source inserted between said second circuit point and said second potential terminal; a sixth MOS transistor of said first channel type in which the current path is inserted between said first potential terminal and said third circuit point and in which the gate is connected to said second circuit point; a seventh MOS transistor of a first conductivity type in which the current path is inserted between said third circuit point and said second potential terminal; a second constant current source inserted between said first potential terminal and said fourth circuit point; an eighth MOS transistor of said first channel type in which the current path is inserted between said fourth circuit point and said second potential terminal and in which the gate is connected to said fourth circuit point; and an amplifying section which is connected at a non-inverting input terminal to said third circuit point, at the inverting input terminal to said first circuit point, and at the output terminal to the gates of said second and seventh MOS transistors.

BRIEF DESCRIPTION OF THE DRAWINGS

FIG. 1 is a circuit diagram of a prior art operational amplifier;

FIG. 2 is a circuit diagram of another prior art operational amplifier;

DETAILED DESCRIPTION OF THE PREFERRED EMBODIMENTS

Figure 3:
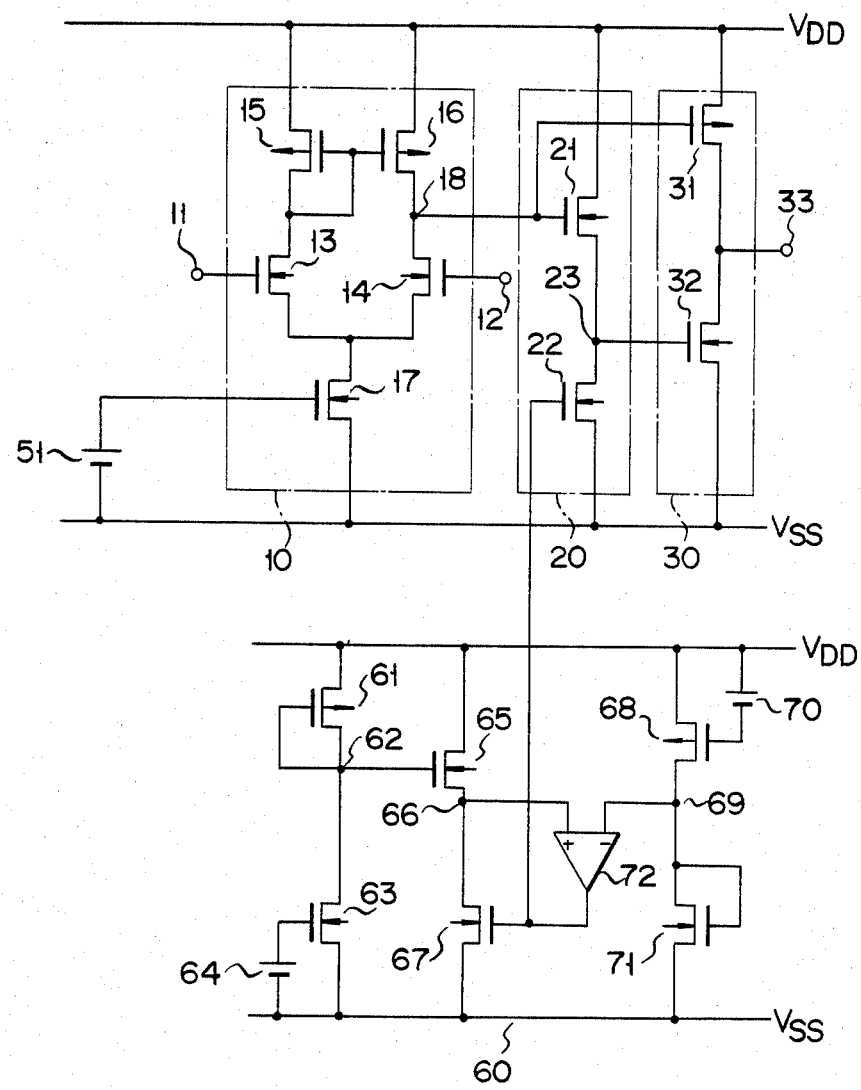
FIG. 3 is a circuit diagram of an embodiment according to the present invention, in which a functional symbol is employed for an operational amplifier expression.

Before preceding with some preferred embodiments of the present invention, it will expressly be understood that throughout the drawings, like reference symbols are applied to like or equivalent portions for the sake of simplicity. Reference is first made to FIG. 3 illustrating a preferred embodiment of an operational amplifier according to the present invention. The operational amplifier shown in FIG. 3 is generally comprised of: a differential amplifier circuit 10; an operational amplifier section including a source follower circuit 20 and an output circuit 30; and a bias section made up of a bias circuit 60. The differential amplifier 10 is comprised of: a pair of N-channel MOS transistors 13 and 14 which are respectively connected at the gates to input terminals 11 and 12 for differential voltage signals; a pair of P-channel MOS transistors 15 and 16 which constitute a current mirror circuit and serve as a load circuit for the transistor pair 13 and 14; and an N-channel MOS transistor 17. The gates of the pair of the MOS transistors 13 and 14 are respectively tied to input terminals 11 and 12 for receiving input signals. The pair of MOS transistors 15 and 16 is interconnected at the gates to each other, and is connected at the sources to the high potential source $V_{DD}$. The drains of these transistors are respectively connected to the sources of a pair of MOS transistors 13 and 14. The drain of the MOS transistor 15 is also connected to the gate of the transistor 15 per se. The drains of the MOS transistors 13 and 14 are connected together to the low potential source $V_{SS}$ by way of a MOS transistor 17. The MOS transistor 17 is connected at the source to the drains of the transistors 13 and 14, at the drain to the low potential source $V_{SS}$, and at the gate to a constant voltage source 51. The constant voltage source 51 thus connects the biases the MOS transistor 17. The source follower circuit 20 is comprised of a pair of N-channel MOS transistors 21 and 22, which respectively drive and load elements, and is connected in series between the $V_{DD}$ applying terminal and the $V_{SS}$ applying terminal. The MOS transistor 21 is connected at the drain to the $V_{DD}$ applying terminal at the source to a first circuit point 23 as a junction of the MOS transistors 21 and 22, and at the gate to a junction 18 of the MOS transistors 14 and 16 as the output terminal of the differential amplifier circuit 10. The MOS transistor 22 is connected at the source to the $V_{SS}$ applying terminal and at the drain to the first circuit point 23. The output circuit 30 is made up of a pair of P-channel MOS transistors 31 and 32, which are connected in series between the $V_{DD}$ applying terminal and the $V_{SS}$ applying terminal. The MOS transistor 31 is connected at the source to the $V_{DD}$ applying terminal, at the drain to a signal output terminal, and at the gate to the output terminal 18 of the differential amplifier circuit 10. The MOS transistor 32 is connected at the drain to the signal output terminal, at the source to the $V_{SS}$ applying terminal and at the gate to the circuit point of the source follower circuit 20.

The arrangement of the bias circuit 60 follows. A P-channel MOS transistor 61 is connected at the source to the $V_{DD}$ applying terminal, and at the drain and the gate to a second circuit point 62. An N-channel MOS transistor 63 is connected at the drain to the second circuit point and at the source to the $V_{SS}$ applying terminal. The second circuit point 62 is at the junction of the MOS transistors 61 and 63. A constant voltage source 64 is inserted between the gate of the MOS transistor 63 and the $V_{SS}$ applying terminal. Therefore, the MOS transistor 63 serves as a constant current source. An N-channel MOS transistor 65 is connected at the drain to the $V_{DD}$ appying terminal, at the source to a third circuit point 66, at the gate to the second circuit point 62. An N-channel MOS transistor 67 is connected at the drain to the third circuit point 66 and at the source to the $V_{SS}$ applying terminal. The third circuit point 66 is an interjunction of the MOS transistors 65 and 67. A P-channel MOS transistor 68 is connected at the source to the $V_{DD}$ applying terminal and at the drain to a fourth circuit point 69. A constant voltage source 70 is coupled between the gate of the MOS transistor 68 and the $V_{DD}$ applying terminal. Therefore, the MOS transistor 68 serves as a constant current source. The drain and gate of an N-channel MOS transistor 71 is coupled with the fourth circuit point 69 and the source thereof to the $V_{SS}$ appying terminal. The fourth circuit point 69 is an interjunction of the MOS transistors 68 and 71. A differential amplifier 72 has an inverting input terminal (−), a non-inverting input terminal (+), and an output terminal. The noninverting terminal (+) of the differential amplifier 72 is connected to the third circuit point 66; the inverting terminal (−) is connected to the fourth circuit point 69; the output terminal is connected to the gate of the MOS transistor 67; and the gate of the MOS transistor 22 is connected to the source follower circuit 20. When the output terminal of the differential amplifier 72 is connected to the gate of the MOS transistor 22 in the source follower circuit 20, the output voltage of the bias circuit 60 is applied to the gate of the MOS transistor 22. The functional and operational description will be given in detail later.

The MOS transistors 21 and 22 in the source follower circuit 20, and the MOS transistors 65 and 67 in the bias circuit 60 are geometrically designed such that: the ratio of W1/L1 and W2/L2 is equal to that of W3/L3 and W4/L4, where the channel widths and the channel lengths of the MOS transistors 21, 22, 65, and 67 are respectively W1-W4 and L1-L4.

The operational amplifier thus arranged will be described next.

Input voltages are applied through the input terminals to the gates of the MOS transistors 13 and 14 in the differential amplifier circuit 10. The differential amplifier circuit 10 differentially amplifies the input voltages and produces the amplified difference voltage at the output terminal, i.e., the junction of the MOS transistors 14 and 16. The output voltage from the differential amplifier circuit 10 is input to the gate of the MOS transistor 31 in the output circuit 30 and also to the gate of the MOS transistor 21 in the source follower circuit 20. The voltage input to the MOS transistor 31 in the output circuit 30 changes its level in the source follower circuit 20. The level shifted voltage is input to the gate of the MOS transistor 32. Specifically, voltages corresponding to the differential input voltages which were applied to the differential amplifier circuit 10 are applied to the gates of the MOS transistors 31 and 32. Then, the output circuit 30 produces the amplified signal at the output terminal connected to the junction of the MOS transistors 31 and 32. As already mentioned, the bias voltage from the bias circuit 60 is applied to the gate of the MOS transistor 22 in the source follower circuit 20.

In the bias circuit 60, the MOS transistors 63 and 68 respectively function as constant current sources. These transistors feed constant currents to the related MOS transistors 61 and 71, respectively. Therefore, the gate-source voltages of the MOS transistors 61 and 71 are kept constant irrespective of any variation in the potential difference between the $V_{DD}$ applying terminal and $V_{SS}$ applying terminal. The differential amplifier 72 controls the gate potential of the MOS transistor 67 so as to make the voltage at the third circuit point 66 equal to that at the fourth circuit point 69. Therefore, the potential at the circuit point 66 is also kept constant irrespective of any variation in the difference in potential between the $V_{DD}$ applying terminal and the $V_{SS}$ applying terminal.

When recalling that the potentials at the circuit points 66 and 69 are equal to each other, it is easily understood that the sum of the gate-source voltages of the MOS transistors 61, 65, and 71 is equal to the potential difference between the $V_{DD}$ applying terminal and the $V_{SS}$ applying terminal. The sum of the gate-source voltages of the MOS transistors 31, 21 and 32 is also equal to the potential difference between the $V_{DD}$ applying terminal and the $V_{SS}$ applying terminal. As already mentioned, the W/L ratio of the MOS transistors 65 and 67 is equal to that of the MOS transistors 21 and 22. Therefore, the gate-source voltage of the MOS transistor 65 in the bias circuit 60 is equal to that of the MOS transistor 21 in the source follower circuit 20. Therefore, the sum of the gate-source voltages of the MOS transistors 31 and 32 in the output circuit 30 is equal to that of the MOS transistors 61 and 71 in the bias circuit 60. As mentioned above, the gate-source voltage of each transistor 61 and 71 is independent of any variation in the power source voltage. Therefore, the sum of the gate-source voltage of the MOS transistors 31 and 32 in the output circuit 30 is kept constant. The constancy of the gate-source voltage of each of MOS transistor 31 and 32 ensures only a slight change in the drain current flowing through the MOS transistors 31 and 32 even when the potential difference between the $V_{DD}$ applying terminal and the $V_{SS}$ applying terminal varies. The result is little variation in the consumption current in the output circuit 30.

Figure 4:
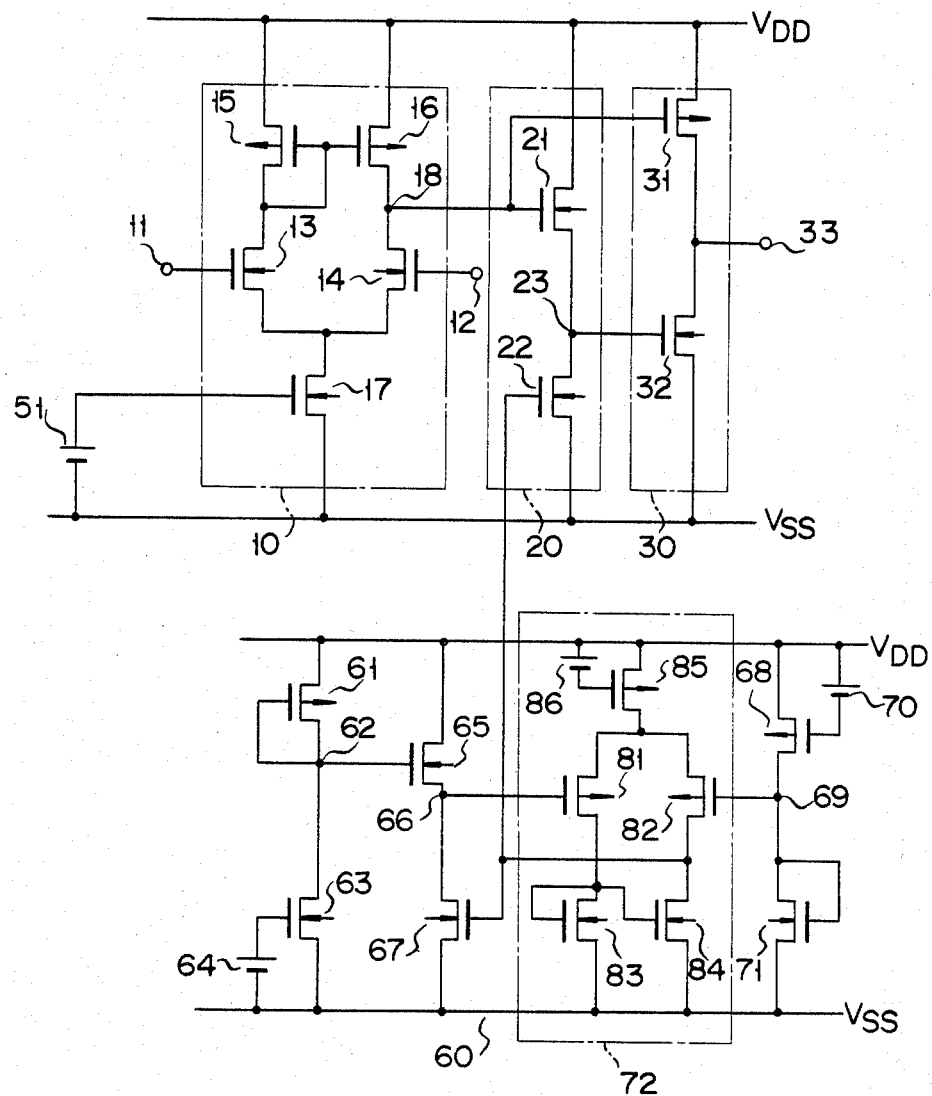
FIG. 4 is a detailed circuit diagram of the operational amplifier shown in FIG. 3.

Turning now to FIG. 4, there is shown a circuit diagram of the operational amplifier of FIG. 3 in which the differential amplifier 72 depicted by a functional symbol in FIG. 3 is illustrated in a circuit diagram. As shown, the differential amplifier 72 is comprised of: a pair of P-channel MOS transistors 81 and 82 in which the gates serve respectively as a non-inverting input terminal and an inverting input terminal; a pair of N-channel MOS transistors which form a current mirror circuit and serve respectively as load circuits of the MOS transistors 81 and 82; a P-channel MOS transistor 85 for feeding a drive current to the pair of the MOS transistors 81 and 82; and a constant current source 86 for biasing the MOS transistor 85. The gates of the MOS transistors 81 and 82 are respectively connected to the circuit points 69 and 66. The sources of the MOS transistors 81 and 82 are connected together at the drain of the MOS transistor 85, and the drains thereof are respectively connected to the drains of the MOS transistors 83 and 84. The sources of the MOS transistors 83 and 84 are connected together to the $V_{SS}$ applying terminal. The gates of the MOS transistors 83 and 84 are connected to each other, and to the drain of the MOS transistor 83. The MOS transistor 83 is diode-connected. The source of the MOS transistor 85 is connected to the $V_{DD}$ applying terminal. The gate of the MOS transistor 85 is connected to the negative terminal of the constant voltage source 86. The positive terminal of the constant voltage source 86 is coupled with the $V_{DD}$ applying terminal. The junction at the drains of the MOS transistors 82 and 84 constitute an output terminal of the differential amplifier 72. The output terminal is coupled with the gate of the MOS transistor 67 in the bias circuit 60 and the gate of the MOS transistor 22 in the source follower circuit 20. The circuit arrangement of the differential amplifier 72 is substantially the same as that of the differential amplifier circuit 10 in that the conducting channel type of the MOS transistors is interchanged, the N-channel to the P-channel is interchanged and vice versa, and that the polarity of the power source voltages $V_{DD}$ to $V_{SS}$ are interchanged, and vice versa.

Figure 5:
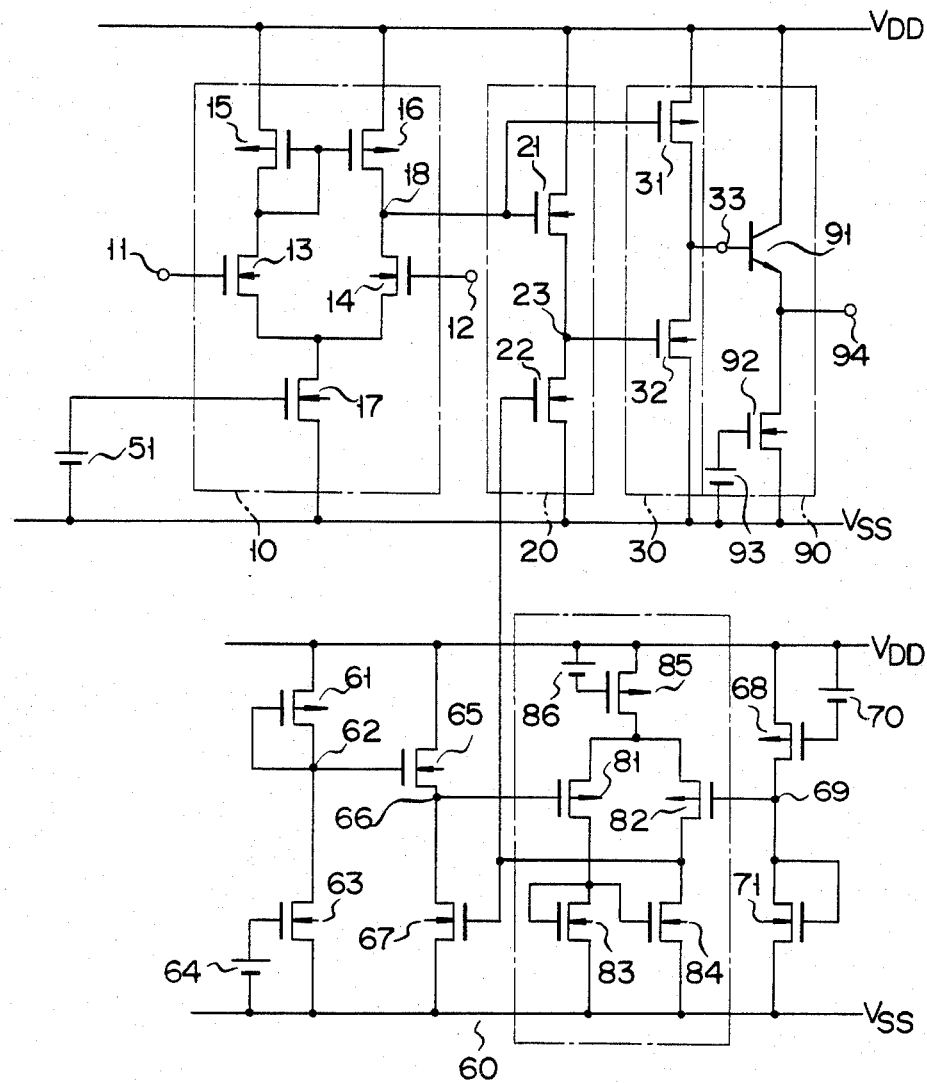
FIG. 5 is a circuit diagram of a modification of the FIG. 4 circuit.

Turning now to FIG. 5, there is shown another embodiment of an operational amplifier according to the present invention. In this embodiment, an emitter follower circuit 90 is additionally provided at the output side of the output circuit 30 in the FIGS. 3 or 4 circuit as in the first embodiment. The remaining portion in this embodiment is exactly the same as that of the first embodiment. As shown, the emitter follower circuit 90 contains an NPN transistor 91, an N-channel MOS transistor 92, and a constant voltage source 93 for biasing the MOS transistor 92. The MOS transistor 91 is connected at the collector to the $V_{DD}$ applying terminal, at the emitter to the drain of the MOS transistor 92, and at the gate to the output terminal of the output circuit 30. The MOS transistor 92 is connected at the source to the $V_{SS}$ applying terminal, and at the gate to the positive terminal of the constant voltage source 93. The negative terminal of the constant voltage source 93 is connected to the $V_{SS}$ applying terminal. The junction of the MOS transistors 91 and 92 is connected to a signal output terminal 94. In the emitter follower circuit 90, the current flowing into the base of the NPN transistor 91 is amplified by its current amplification factor $h_{FE}$, and the amplified signal is derived from the output terminal 33.

Figure 6:
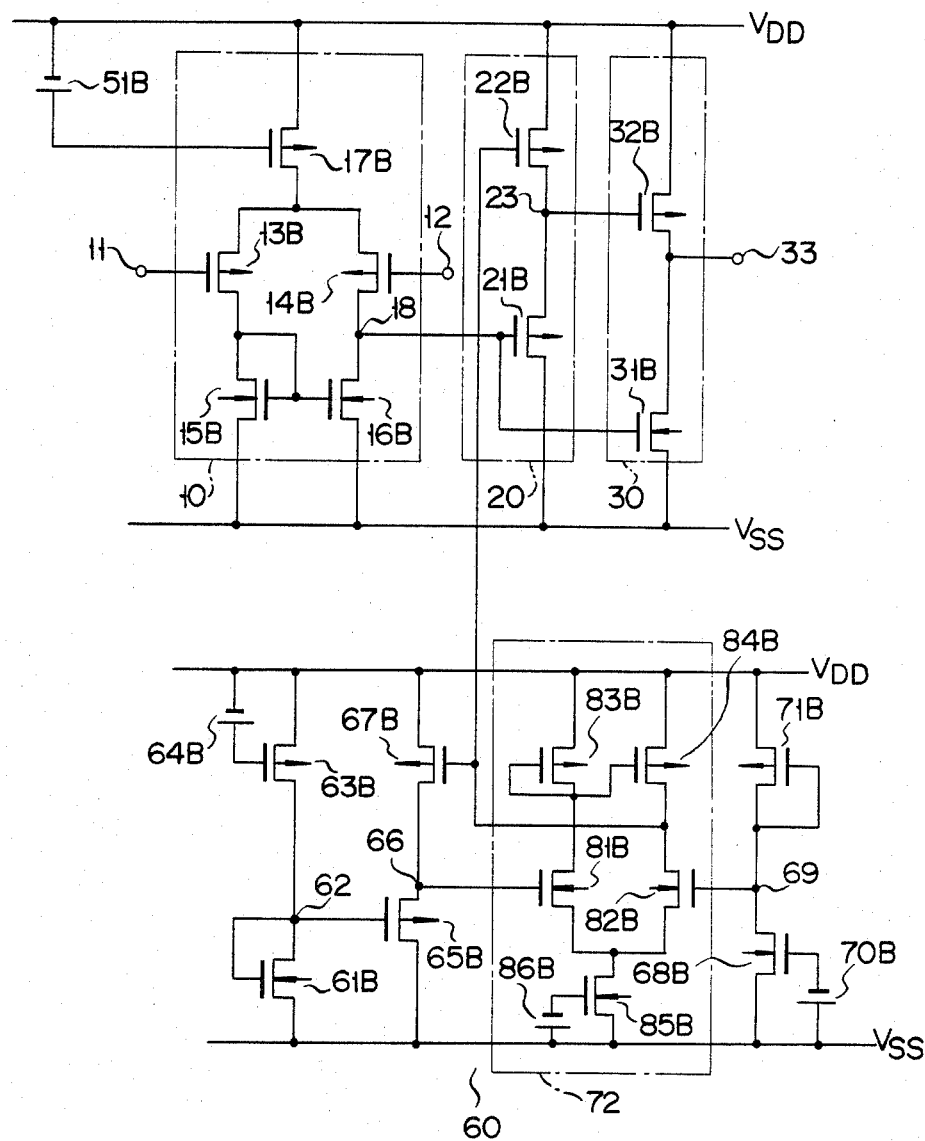
FIG. 6 is a circuit diagram of another embodiment according to the present invention.

The circuit arrangement of FIG. 6 is a modification of the first embodiment in that the channel type of the MOS transistors is interchanged. The P-channel and N-channel switch, and the polarity of the power source voltage are interchanged, $V_{DD}$ becomes $V_{SS}$ and vice versa. Accordingly, the polarity of each constant voltage source is inverted. In this embodiment, like portions are designated by the same reference numerals and are followed by the captital letter B.

Figure 7:
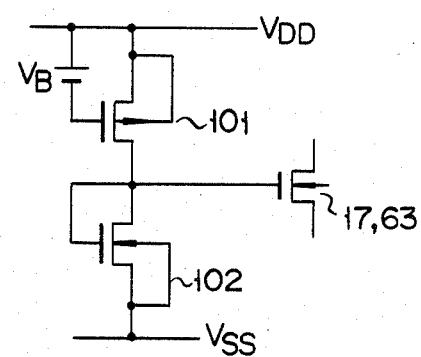
FIGS. 7 and 8 illustrate circuit diagrams of a circuit arrangement which can be applied for constant voltage sources in the FIGS. 3 and 4 circuit.
Figure 8:
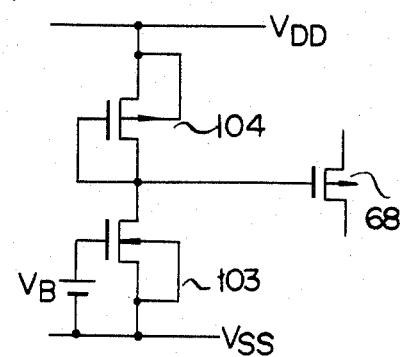

In FIGS. 7 and 8, there are shown two examples of the detailed circuit arrangements of the constant voltage sources 51 or 64, and the constant voltage source 70 used in the above-mentioned embodiments. The circuit arrangement shown in FIG. 7, designed for the constant voltage source circuit 51 or 64, is comprised of: a P-channel MOS transistor 101 applied with a bias voltage $V_B$ which serves as a constant current source; and an N-channel MOS transistor which is fed with a constant current from the constant current source 101 which provides a gate - source voltage as a bias constant voltage. The source of the MOS transistor 101 is coupled to the $V_{DD}$ applying terminal and its drain, and to the drain of the MOS transistor 102. The gate of the MOS transistor 101 is connected to the negative terminal of the constant voltage source $V_B$. The positive terminal of the constant voltage source $V_B$ is connected to the $V_{DD}$ applying terminal. The source of the MOS transistor 102 is connected to the $V_{SS}$ applying terminal with the gate connecting to the drain of the transistor itself. A constant voltage is derived from the junction of the MOS transistors 101 and 102.

The constant voltage source 70 is comprised of an N-channel MOS transistor 103 connected at the gate to the bias voltage $V_B$ which serves as a constant current source and a P-channel MOS transistor 104 fed with a constant current from the constant current source 103 which provides the gate - source voltage as a constant bias voltage. The source of the MOS transistor 103 is connected to the $V_{SS}$ applying terminal and the drain thereof is connected to the drain of the MOS transistor 104. The gate of the same transistor is connected to the positive terminal of the constant voltage source $V_B$. The positive terminal of the constant voltage source $V_B$ is connected to the $V_{SS}$ applying terminal. The source of the $V_{DD}$ applying terminal is connected to the $V_{DD}$ applying terminal and its gate, and to the drain of the transistor itself. The output constant voltage is derived from the junction of the MOS transistors 103 and 104.

Figure 9:
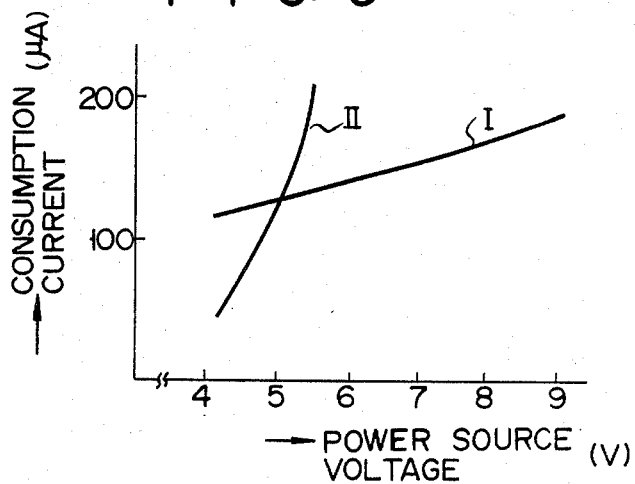
FIG. 9 is a graph which illustrates the difference between the consumption current and the power voltage of the FIG. 3 circuit.

FIG. 9 illustrates the relationship between the consumption current and the power voltage of the operational amplifier of FIG. 3 according to the present invention and the prior art. A curve denoted as I represents the relationship of the consumption current against the power voltage of the FIG. 3 circuit, while a curve II indicates the relationship of the prior art. The curve I indicates that when the power voltage changes from 4 V to 9 V, the consumption current only slightly changes, i.e., from 115 $\mu$A to 185 $\mu$A. That is, the consumption current increases merely 60%. On the other hand, in the prior art, for even a slight change in the power voltage from 4 V to 5.5 V, the consumption current would greatly change from 35 $\mu$A to 215 $\mu$A. This increase of the consumption current is approximately 620%. As for the band width, in the present embodiment, it is at most 30% against the power voltage change of 4 V to 9 V, while in the prior art it is 150% against the power voltage change from 4 V to 5.5 V.

In the above-mentioned embodiments, any variation in the current flowing through the series circuit of the MOS transistors 21 and 22 in the source follower circuit 20 and through the series circuit of the MOS transistors 65 and 67 in the bias circuit 60, can be constrained to be negligible if the W/L ratio of the MOS transistors 21 and 65 is set to be satisfactorily small. If it is so set, the variation of the consumption current in the output circuit 30 can also be constrained to be small. Therefore, a varation of "gm" of each transistor 21, 22, 65 and 67 can also be kept small. As a result, a good amplifying characteristic is obtained over a broad range of the power voltage change. Further, a variation in the power voltage appears in the form of a variation in the gate - source voltage of the MOS transistor 21 in the source follower circuit 20. In this case, the gate - source voltage of the MOS transistor hardly changes in the output circuit 30. Therefore, the source - drain voltage of the MOS transistor 16 is kept substantially constant. As a result, the source - drain voltage of the MOS transistors 15 and 16 of the current mirror circuit in the differential amplifier circuit 10 is kept in a balanced state. The result is that the offset is minimized, the PSRP (power supply rejection ratio) is improved, and thus the noise influence by the power source can be minimized.

As described above, in the present invention, any variation in the power voltage is detected as a variation in the gate-source voltage of the MOS transistor 65 in the bias circuit 60. This variation is transformed into a variation of the gate-source voltage of the MOS transistor 21 in the source follower circuit 20. In this way, the sum of the gate-source voltages of the MOS transistors 31 and 32 is kept constant and independent of a variation in the power voltage.

Figure 10:
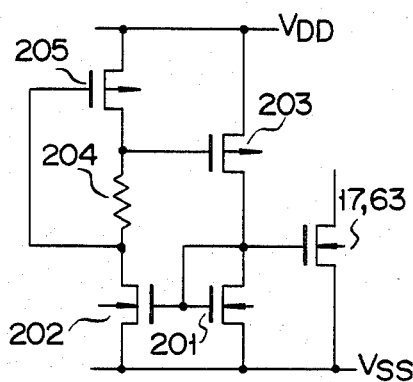
FIGS. 10 and 11 are circuit diagrams of circuit arrangements which can be applied as constant voltage sources in the FIGS. 3 and 4 circuit.

FIG. 10 shows another circuit arrangement of a constant voltage source 51 or 64 in the FIG. 3 embodiment. As shown, the circuit arrangement of FIG. 10 is comprised of: a pair of N-channel MOS transistors 201 and 202 which form a current mirror circuit; a P-channel MOS transistor 203 connected in series to the MOS transistor 201; and a P-channel connected in series to the MOS transistor 202 via a resistor 204 for current setting. The source of the MOS transistor 201 is connected to the $V_{SS}$ applying terminal, and its drain is connected to the drain of the MOS transistor 203. The gate of the MOS transistor 201 is connected to the drain of the transistor itself and also to the gate of the MOS transistor 202. The source of the MOS transistor 202 is coupled with the $V_{SS}$ applying terminal, and its drain is coupled to the drain of the MOS transistor 205 through the resistor 204. The source of the MOS transistor 203 is connected to the $V_{DD}$ applying terminal, and its gate is connected to the drain of the MOS transistor 205. The source of the MOS transistor 205 is connected to the $V_{DD}$ applying terminal, and its gate is connected to the drain of the MOS transistor 202. The junction of the MOS transistors 201 and 203 is connected to the gate of the MOS transistor 17.

With a constant voltage source thus arranged, upon impression of the power voltage, current will flow through a path of the MOS transistors 203 and 201. Another current will flow through a path of the MOS transistor 205, the resistor 204 and the MOS transistor 202. In the latter current path, the current value is limited to a value specified by the resistor 204. The current mirror made up of the MOS transistors 201 and 202 makes the currents in both the paths equal to each other. These currents are constant irrespective of any variation of the threshold voltage of each MOS transistor. Therefore, the potential at the junction of the MOS transistors 201 and 203 is fixed, and the potential at the gate of the MOS transistor 17 is also fixed. In this way, the current flowing through the MOS transistor 17 is kept at a constant value.

Figure 11:
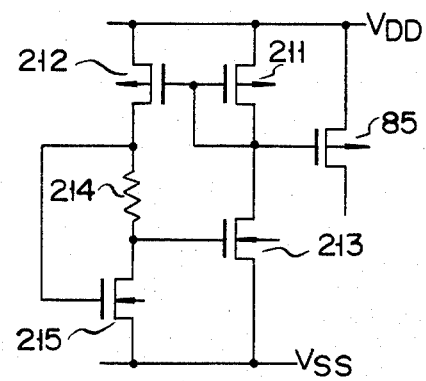

FIG. 11 illustrates a circuit arrangement used for the constant voltage source 86 in the differential amplifier 72 of the FIG. 3 embodiment. The FIG. 11 circuit is composed of a pair of MOS transistors 211 and 212, an N-channel MOS transistor 213 connected in series to the MOS transistor 211, and an N-channel MOS transistor 214 connected through a resistor 214 to the MOS transistor 212. The source of the MOS transistor 211 is connected to the $V_{DD}$ applying terminal, and its drain is connected to the drain of the MOS transistor 213. The gate of the MOS transistor 211 is connected to the drain of the transistor itself and also to the gate of the MOS transistor 212. The source of the MOS transistor 212 is coupled with the $V_{DD}$ applying terminal, and its drain via the resistor 214 is coupled to the drain of the MOS transistor 215. The source of the MOS transistor 213 is connected to the $V_{SS}$ applying terminal, and its gate is connected to the drain of the MOS transistor 215. The MOS transistor 215 is connected at the source to the $V_{SS}$ applying terminal and at the gate to the drain of the MOS transistor 212. The junction of the MOS transistors 211 and 213 is connected to the gate of the MOS transistor 85.

In such a circuit arrangement, upon impression of the power voltage, current flows through a path of the MOS transistors 201 and 203. Another current flows through the path of the MOS transistor 212, the resistor 214 and the MOS transistor 215. The current in the latter path is limited to a value specified by the resistor 214. The current mirror circuit of the pair of the MOS transistors makes the currents of those paths equal to each other. These currents are constant irrespective of any variation of the threshold voltage of each transistor. This keeps constant the potential at the junction of the MOS transistors. The result is that the potential at the gate of the MOS transistor 85 and the current flowing through the MOS transistor 85 are both kept constant.

As described above, in the operational amplifier according to the invention, a satisfactory characteristic is exhibited over a broad range of variation in the power voltage, while the small amount offset is contained in the output voltage.

What is claimed is:

1. An operational amplifier comprising a first potential terminal, a second potential terminal, a signal input terminal, a signal output terminal, first, second, third and fourth circuit points, amplifying means for amplifying an input signal applied through said signal input terminal and producing the amplified signal at the output terminal, level shift means for shifting the level of the signal output from said amplifying means, output means for receiving the output signals from said amplifying means and from said level shift means and producing an output signal as specified by said input signals, and bias means for applying a bias voltage to said level shift means, said operational amplifier in which said level shift means includes a first MOS transistor of a first channel type in which the current path is connected between said first potential terminal and said first circuit point and the gate is connected to said output terminal of said amplifying means, and a second MOS transistor of said first channel type in which the current path is inserted between said second potential terminal and said first circuit point; said output means includes a third MOS transistor of said second channel type in which the current path is inserted between said first potential terminal and said output terminal and the gate is connected to said output terminal of said amplifying means, and a fourth MOS transistor of said first channel type in which the current path is inserted between said signal output terminal and said second potential terminal and the gate is connected to said first circuit point, and said bias means includes a fifth MOS transistor of said second channel type in which the current path is inserted between said first potential terminal and said second circuit point and the gate is connected to said second circuit point, a first constant current source inserted between said second circuit point and said second potential terminal, a sixth MOS transistor of said first channel type in which the current path is inserted between said first potential terminal and said third circuit point and the gate is connected to said second circuit point, a seventh MOS transistor of said first channel type in which the current path is inserted between said third circuit point and said second potential terminal, a second constant current source inserted between said first potential terminal and said fourth circuit point, an eighth MOS transistor of said first channel type in which the current path is inserted between said fourth circuit point and said second potential terminal and the gate is connected to said fourth circuit point, and an amplifying section which is connected at a non-inverting input terminal to said third circuit point, at the inverting input terminal to said fourth circuit point, and at the output terminal to the gates of said second and seventh MOS transistors.

2. An operational amplifier according to claim 1, in which the following relation is satisfied $$W1/L1/W2/L2 \simeq W6/L6/W7/L7$$

where W1, W2, W6 and W7, and L1, L2, L6 and L7 are respectively the channel widths and the channel lengths of said first, second, sixth and seventh MOS transistors.

3. An operational amplifier according to claim 1, in which said first and second channel types of said MOS transistors are respectively N and P-channel types, said first potential terminal has a high potential and said second potential terminal has a low potential.

4. An operational amplifier according to claim 1, in which said first and second channel types of said MOS transistors are respectively P and N-channel types, said first potential terminal has a low potential and said second potential terminal has a high potential.

5. An operational amplifier according to claim 1, in which said amplifying section includes constant current sources connected at one end to said first potential terminal, a load circuit containing a pair of MOS transistors of said second channel type of which the current paths are respectively fed with currents from said constant current sources, and a current mirror circuit containing a pair of MOS transistors of said first channel type which is inserted between said load circuit and said second potential terminal and in which the current paths are connected in series to the current paths of the pair of said MOS transistors in said load circuit.

6. An operational amplifier according to claim 5, in which one of the pair of said MOS transistors forming said load circuit is connected to a junction of said sixth and seventh MOS transistors and the other to a junction of said second constant current source and said eighth MOS transistor, the pair of said MOS transistors forming said current mirror circuit is interconnected at the gates, the gate and drain of one of said MOS transistors is interconnected, a junction of said other MOS transistor and the other of said latter recited pair of MOS transistors is connected to the gates of said second and seventh MOS transistors.

7. An operational amplifier according to claim 1, further comprising a circuit including a transistor in which the current path is connected at one end to said first potential terminal and the control terminal is connected to a junction of said third and fourth MOS transistors forming said output circuit, a constant current source inserted between the other end of said current path of said transistor and said second potential terminal, the junction of said transistor and said constant current source forming a signal output terminal.

8. An operational amplifier according to claim 1, in which said first constant current source includes a constant current source connected to said first potential terminal, a constant voltage element connected between the other end of said constant current source and said second potential terminal, and a MOS transistor of said first channel type in which the current path is inserted between said second circuit point and said second potential terminal and the gate is connected to a junction between said constant current source and said constant voltage element.

9. An operational amplifier according to claim 1, in which said second constant current source includes a constant current source connected to said second potential terminal, a constant voltage element connected between the other end of said constant voltage source and said first potential terminal, and a MOS transistor of said second channel type in which the current path is inserted between said fourth circuit point and said first potential terminal and the gate is connected to a junction between said constant current source and said constant voltage element.

10. An operational amplifier according to claim 8, in which said constant voltage element is a diode-connected MOS transistor of said first channel type in which the current path is connected between said other end of said constant voltage source and second potential terminal, and a junction of said constant voltage source and said current path of said diode-connected MOS transistor is connected to the gate of said MOS transistor whose current path is inserted between said second circuit point and said second potential terminal.

11. An operational amplifier according to claim 9, in which said constant voltage element is a diode-connected MOS transistor of said second channel type in which the current path is connected between said other end of said constant voltage source and said first potential terminal, and a junction of said constant voltage source and said current path of said diode-connected MOS transistor is connected to the gate of said MOS transistor whose current path is inserted between said fourth circuit point and said first potential terminal.

12. An operational amplifier according to claim 1, in which said first constant current source comprises ninth and tenth MOS transistors of said first channel type forming a current mirror circuit in which the current path is connected at one end to said second potential terminal and connected at the gates to each other, said ninth MOS transistor being diode-connected, and a pair of eleventh and twelfth MOS transistors of said second channel type in which the current paths are respectively connected between the other ends of the pair of said ninth and tenth MOS transistors forming said current mirror circuit and said first potential terminal and in which the gates are interconnected, said twelfth MOS transistor being diode-connected, and a thirteenth MOS transistor of said first channel type whose gate is connected to the junction of said ninth MOS transistor and said eleventh MOS transistor.

13. An operational amplifier according to claim 5, in which said constant current source includes a pair of fourteenth and fifteenth MOS transistors of said second channel type forming a current mirror circuit in which the current path is connected to said first potential terminal and at the gates to each other, said fourteenth MOS transistor being diode-connected, and a pair of sixteenth and seventeenth MOS transistors of said first channel type in which the current paths are respectively connected between the other ends of the current paths of the pair of said fourteenth and fifteenth MOS transistors forming said current mirror circuit and said second potential terminal and in which the gates are interconnected, said seventeenth MOS transistor being diode-connected, and a eighteenth MOS transistor of said second channel type whose gate is connected to the junction of said fourteenth MOS transistor and said sixteenth MOS transistor is connected to the gate of said eighth MOS transistor.

14. An operational amplifier according to claim 12, in which said tenth MOS transistor and said twelfth MOS transistor are interconnected through a current limiting resistor, the gate of said eleventh MOS transistor is connected to the end of said resistor closest to said twelfth MOS transistor, the gate of said twelfth MOS transistor is connected to the end of said resistor closest to said tenth MOS transistor.

15. An operational amplifier according to claim 13, in which said fifteenth MOS transistor and said seventeenth MOS transistor are interconnected through a current limiting resistor, the gate of said sixteenth MOS transistor is connected to the end of said resistor closest to said seventeenth MOS transistor, the gate of said seventeenth MOS transistor is connected to the end of said resistor closest to said fifteenth MOS transistor.

* * * * *